United States Patent
Cherniak et al.

(10) Patent No.: US 11,757,465 B2
(45) Date of Patent: Sep. 12, 2023

(54) DEVICES AND METHODS FOR VOLTAGE REGULATION

(71) Applicant: Infineon Technologies AG, Neubiberg (DE)

(72) Inventors: Kyrylo Cherniak, Villach (AT); Werner Hoellinger, Klagenfurt (AT); Stefano Marsili, Faak am See (AT); Volha Subotskaya, Villach (AT)

(73) Assignee: Infineon Technologies AG, Neubiberg (DE)

( * ) Notice: Subject to any disclaimer, the term of this patent is extended or adjusted under 35 U.S.C. 154(b) by 292 days.

(21) Appl. No.: 17/325,409

(22) Filed: May 20, 2021

(65) Prior Publication Data

US 2021/0367609 A1    Nov. 25, 2021

(30) Foreign Application Priority Data

May 20, 2020 (DE) .................... 10 2020 113 719.2
Jun. 5, 2020 (DE) .................... 10 2020 115 043.1

(51) Int. Cl.
| | | |
|---|---|---|
| *H03M 1/12* | (2006.01) | |
| *H03M 1/40* | (2006.01) | |
| *H02M 3/157* | (2006.01) | |
| *H02M 1/14* | (2006.01) | |
| *H02M 1/00* | (2006.01) | |
| *H02M 3/07* | (2006.01) | |
| *H02M 1/36* | (2007.01) | |

(52) U.S. Cl.
CPC .......... *H03M 1/403* (2013.01); *H02M 3/157* (2013.01); *H02M 1/00* (2013.01); *H02M 1/14* (2013.01); *H02M 1/36* (2013.01); *H02M 3/07* (2013.01)

(58) Field of Classification Search
CPC ........ H03M 1/403; H02M 3/157; H02M 3/07; H02M 1/14; H02M 1/00; H02M 1/36
See application file for complete search history.

(56) References Cited

U.S. PATENT DOCUMENTS

| | | |
|---|---|---|
| 8,390,366 B2 | 3/2013 | Pagano et al. |
| 10,027,223 B1 * | 7/2018 | Zhang ..................... H02M 3/07 |
| 2002/0121883 A1 | 9/2002 | Bartenschlager et al. |
| 2009/0016085 A1 | 1/2009 | Rader et al. |
| 2013/0181521 A1 | 7/2013 | Khlat |

FOREIGN PATENT DOCUMENTS

| | | |
|---|---|---|
| DE | 10110273 A1 | 9/2002 |
| DE | 10149907 A1 | 3/2003 |
| DE | 102018122700 A1 | 3/2019 |
| WO | 0171893 A2 | 9/2001 |

* cited by examiner

*Primary Examiner* — Joseph J Lauture
(74) *Attorney, Agent, or Firm* — Eschweiler & Potashnik, LLC (57) ABSTRACT

A converter includes a switched capacitor circuit that includes at least one capacitor and a plurality of main switches to provide an output current in response to an input voltage applied to the switched capacitor circuit. The converter further includes one or more bypass transistor switches to selectively provide an additional output current. The converter includes a common controller that controls the plurality of main switches and the one or more bypass transistor switches.

19 Claims, 8 Drawing Sheets

DEVICES AND METHODS FOR VOLTAGE REGULATION

REFERENCE TO RELATED APPLICATION

This application claims priority to German Application No. 10 2020 113 719.2, filed on May 20, 2020, as well as DE 10 2020 115 043.1, filed Jun. 5, 2020, the contents of which are hereby incorporated by reference in their entirety.

TECHNICAL FIELD

Various embodiments relate generally to voltage converters.

BACKGROUND

Switched capacitor DC-DC (SC-DCDC) converters are typically designed for a strict output power limit or, in other words, at constant output voltage ($V_{out}$) for the maximum current capability. If the output current exceeds the maximum current capability, then the output voltage starts to drop, in the so called drop-out state. This would lead to the under voltage monitoring triggering in the system. As such SC-DCDCs must be designed to supply at full efficiency all peak currents. However, classical SC-DCDC do not have the state with degraded efficiency for higher loads like in LC-DCDC converters.

Since output current capability can be very dependent on process, voltage, and temperature variation, SC-DCDCs should be designed for the worst corner or worst case scenario, in terms of speed, temperature, minimum voltage, and for the maximum pulse output current. As a result, there is typically a lot of overdesign for 90% of other operation point and usually very big area increase, e.g., for chips designed for integrated solutions.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the described embodiments. In the following description, various embodiments are described with reference to the following drawings, in which.

DESCRIPTION

The following detailed description refers to the accompanying drawings that show, by way of illustration, specific details and embodiments which may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Figure 1:
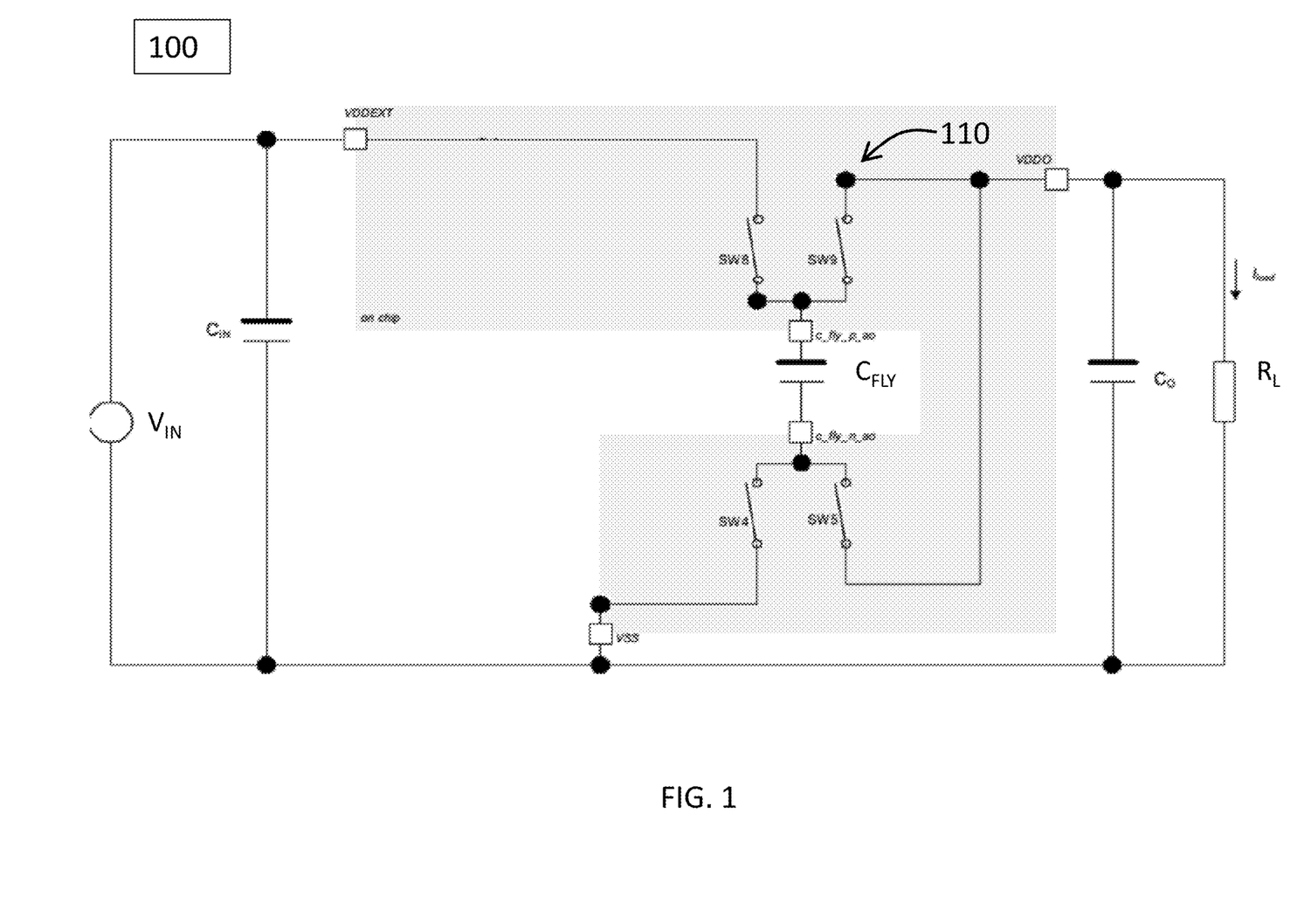
FIG. 1 shows an example switched capacitor converter.
Figure 2:
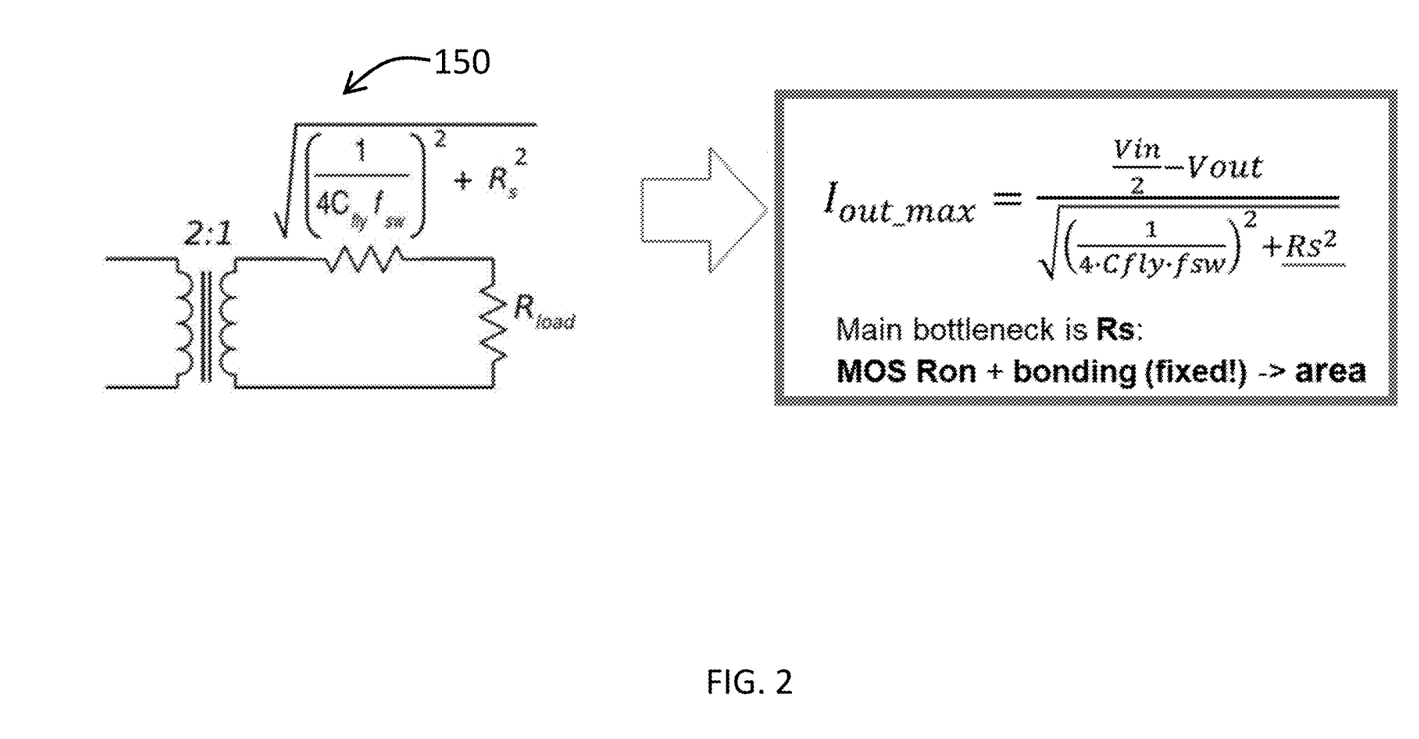
FIG. 2 shows a simplified equivalent circuit model of the switched capacitor of FIG. 1.

FIG. 1 shows a known a circuit arrangement 100 including a switched capacitor DC-to-DC (SC-DCDC) converter 110. FIG. 2 shows a simplified equivalent model of output resistance 150. The SC-DCDC converter 110 is shown in ½ operation mode. In order to increase the current capability of the SC-DCDC converter 110, the equivalent output resistance of SC-DCDC converter should be decreased. This can be done by tuning one of 3 parameters: flying capacitor values, switching frequencies, or the resistance in the current path, series connection of switch, bonding, or package.

However, changing the $C_{FLY}$ value directly is typically not a preferred solution and has a very limited impact on the equivalent output resistance due to interdependencies of other parameters. With respect to switching frequency, many applications prefer to have a fixed switching frequency due to EMI considerations. Further, an increase in the switching frequency directly leads to an increase of switching losses, what can significantly decrease the efficiency.

Typically, the resistance in the current path Rs, (e.g., switch, bonding, package, PCB, internal and external chip connections, etc.) is the bottleneck for the current capability of SC-DCDC converter and optimization of resistance leads to significant improvements. Nevertheless, this optimization is limited and very costly. For example, resistance due to the type of package and resistance of connections, e.g., a bond in a Quad-Flat Package (QFP) and bond of a ball in a ball grid array (BGA) is very limited or very costly.

Some SC-DCDC converters are designed to stop switching and go into a bypass mode, a LDO mode, if the output load increases above the maximum current capability. However, this solution can solve the problem of high output loads but can reduce the efficiency.

Figure 3A:
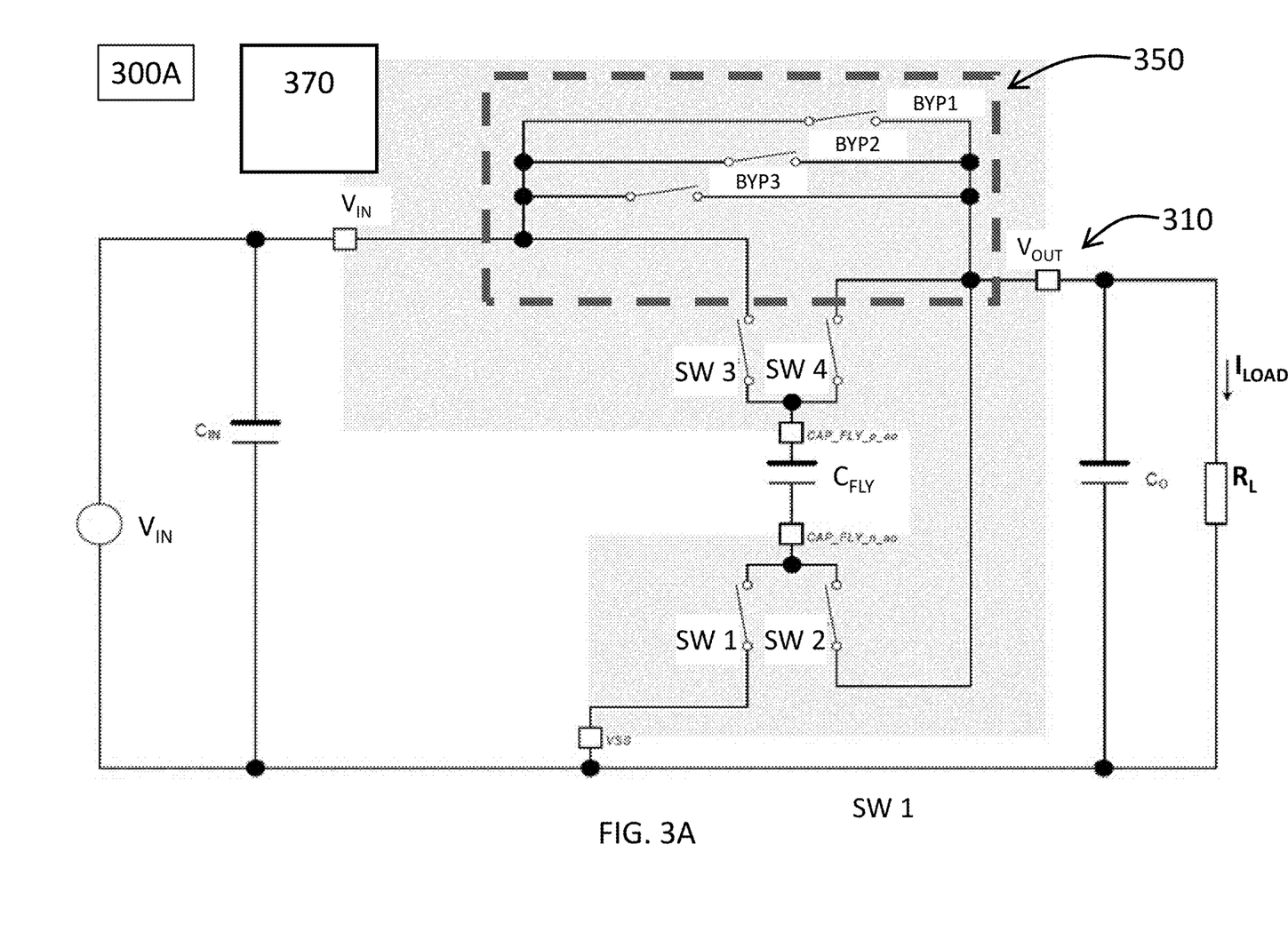
FIGS. 3A-3B show example circuits according to at least one exemplary embodiment of the present disclosure.

Another solution of the problem is to increase the number of flying capacitors and operate multiple SC-DCDC converters in parallel at high loads. The efficiency for such solutions is good, but the drawback is increase of the area by factor of parallel stages, increase of the pin count, and increase in costs FIG. 3A shows a converter 300A according to one or more exemplary embodiments of the present disclosure. The converter 300A shown in FIG. 3 includes a SC-DCDC converter 310, which can a known SC-DCDC converter such as the one depicted in FIG. 1. The SC-DCDC converter or circuit 310 may be configured to operate in a half (½) mode operation. While the SC-DCDC circuit 310 is shown with a single fly capacitor ($C_{FLY}$) and four switches (main switches SW1, SW2, SW3, and SW4), this is merely exemplary and other variations can be realized. That is, the SC-DCDC circuit 310 may have multiple fly capacitors and a different number of switches, and may operate in other modes, e.g., 1/N (where N is an integer).

Converters, such as the converter 300A includes, in addition to the SC-DCC circuit, an arrangement of one or more bypass switches. In the example of FIG. 3, the converter 300A further includes an arrangement 350 of three bypass transistor switches (BYP 1-3). In general, converters, such as the converter 300 can include any suitable quantity (one or more) of bypass switches.

In accordance with exemplary embodiments of the present disclosure, the bypass switches BYP1-BYP3 can be transistor bypass switches, e.g., of a low-dropout (LDO) regulator circuit. That is, the arrangement 350 can be considered or implemented as an LDO regulator circuit. In one or more exemplary embodiments, bypass transistor switches can include or use MOSFET switches.

The bypass switches of the arrangement 350 or the LDO 350 in FIG. 3, may be used or configured to operate as an extension of the main switches SW1-SW4 of the SC-DCDC converter 310. More specifically, the bypass switches BYP1-BYP3 can be configured to deliver small portions of extra current to the output load, e.g., with LDO-like efficiency. In other words, the bypass switches may add or supplement the output current produced by the SC-DCDC 310. Further, in the converter 300, the arrangement 350 may be implemented so that the bypass transistor switches BYP1-BYP3 may be connected between an input (VIN) and an output ($V_{OUT}$), e.g., of the SC-DCDC converter 310. As such, the bypass transistor switches BYP1-BYP3 form a parallel device to the SC-DCDC circuit 310, e.g., a parallel LDO.

In accordance with exemplary embodiments of the present disclosure, the converter 300A can produce an output current to a load ($R_L$) that is a combination of the high-efficient output current from the main SC-DCDC switches and a low-efficient current through bypass switches (e.g., a parallel digital LDO). So instead of sharp drop of output voltage at the normal end of capability range of a SC-DCDC circuit, the converter 300A experiences only slight decreases in efficiency but continues operation.

In accordance with exemplary embodiments of the present disclosure, the converter 300A includes a controller 370 for controlling the SC-DCDC converter 310 and the bypass switches BYP1-BYP3. That is, the controller 370 may be implemented as a single controller or common controller that controls both the SC-DCDC circuit 310 and the bypass switch arrangement 350 (LDO). The physical and logical connections from the controller 370 to other elements (e.g., the SC-DCDC circuit 310, the bypass switches BYP1-BYP3, interfaces, etc.) are not shown for simplicity sake.

The controller 370 can control the closing and opening of the switches of the SC-DCDC converter 310 and the bypass switches BYP1-BYP3. Further, the controller 370 can control the switching frequency for switches of the SC-DCDC converter 310 and the switching frequency for the bypass switches BYP1-BYP3.

In one or more embodiments, the controller 370 be configured so that the SC-DCDC converter 310 operates normally or without any assistance until the converter 310 reaches its maximum capability, e.g., until the SC-DCDC converter 310 outputs its maximum output current. The SC-DCDC circuit 310 can provide an output current to the load $R_L$ at a constant voltage but only within a certain operating range. Beyond the upper limit or maximum boundary of this operating range, the performance of the SC-DCDC converter 310 will begin to degrade. Accordingly, to prevent this, the controller is configured to control the bypass transistor switches BYP1-BYP3 to provide a supplemental current to the output current of the SC-DCDC circuit 310 when the SC-DCDC circuit 310 reaches its limits.

Therefore, the controller 370 can be configured to close (or turn on) the one or more of the bypass transistor switches BYP1-BYP3 only when the output current of the SC-DCDC 310 reaches or exceeds maximum current capability. As a result, the total output current becomes a mix or combination of a high efficiency current via main switches of SC-DCDC converter 310 and low efficiency current via bypass switches BYP1-BYP3. For such hybrid operation, fine regulation of the output voltage is still given and defined purely by the main switches of the SC-DCDC converter.

Accordingly, the converter 300A can be used for applications where the required load current may at times exceed the maximum current capability of a SC-DCDC converter. The converter 300A does not require a change in the topology (extra flying capacitor or more expensive converters, like an inductor-based DCDC) of a SC-DCDC converter. Further, for output loads much higher than the maximum current capability of SC-DCDC, combined efficiency of the SC-DCDC with the one or more bypass transistor switches is still much higher than the efficiency of a LDO.

In one example, a converter such as or similar to the converter 300A may include a SC-DCDC circuit/converter designed for a maximum output ($I_{out\_max}$) of 200 mA, but due to larger than predicted leakage, can have a real maximum output current ($I_{out\_max}$) at a high temperature, e.g., 170° C., of 250 mA. Converters, such as the converter 300A, can be designed so that instead of output voltage dropping after the output current $I_{LOAD}$ reaches 200 mA and causing a reset of the system, a controller (e.g., controller 370) turns on (e.g., switches/closes) one or more bypass switches to supply an extra 50 mA current to the load. This will still allow for the combined efficiency will still be very high. The combined efficiency can be estimated as:

$$Eff = \frac{I_{load} * V_{out}}{V_{in} * (I_{bypass} + V_{out}/V_{in} * I_{switches} * Eff\_\max}$$

where
I_load=current through load $R_L$
I_bypass=current through bypass switches
I_switches=I_load−I_bypass->current delivered with main switches of SC-DCDC converter
Eff_max=maximum theoretical efficiency of SC-DCDC, for ½ mode:

$$Eff_{max} = \frac{V_{out}}{0.5 * (V_{in} - V_{drop})} - Eff_{drop}$$

V_drop=drop on the bond wire connected to VDD
Eff_drop=estimated efficiency drop due to Iq (quiescent current or the current consumed from Vin by internal circuits of SC-DCDC required for correct operation (e.g. ADC, biasing, drivers from internal circuits of SC-DCDC and other minor losses.)

In accordance with exemplary embodiments of the present disclosure, bypass switches of converters such as or similar to converter 300A may be implemented in equal or different ratios with respect to the resistance or conductance of the bypass switches. For example, the switches BYP1-

BYP3 may be weighted so as to be integer multiples of each other in terms of resistance (or conductance).

In one example, an arrangement of bypass transistor switches (e.g. such as arrangement 350) may include 9 bypass transistor switches in total. Further, such switches may be realized or implemented with having several base switches with a resistance R, one switch with a resistance 2×R (a switch with a resistance two times the base switch resistance), and a one switch with resistance 4×R (a switch with a resistance two times the base switch resistance). Other variations are possible.

As described herein, in order to achieve best dynamic and static performance (accuracy, ripple, over/undershoot, efficiency) the main switches of the SC-DCDC converter and the bypass transistors switches are controlled, e.g., by a single controller. The sizing of bypass transistor switches can depend on the performance of main switches.

In accordance with exemplary embodiments of the present disclosure, control of bypass transistor switches herein may be realized in a relatively simple manner. For example, when an output load is close to max (e.g., output current of main switches nears a max), the controller can enable the bypass switch. Similarly, when load is low (e.g., output current of main switches less than max) the controller can disable the one or more bypass switches (e.g., open the switch). Controllers described herein may use other measurements or factors for deciding when to enable or activate bypass switches.

In exemplary embodiments, a controller may cause the output of current from an SC-DCDC circuit and bypass switches without a sharp differentiation (e.g., in terms of current provided) between main switches (from SC-DCDC) and the bypass switches. As such, a smooth simultaneous operation can be realized without drawbacks in dynamic performance (e.g., over/undershoots during load and line jumps).

In one or more embodiments, a controller may be configured to digitally control the bypass switches. For example, a controller, such as controller 370 may output one or more control signals, e.g., a control word for an SC-DCDC converter (e.g., converter 310). The control output word may cause particular switches to be closed in order to supply the output load in a current operational point.

Figure 3B:
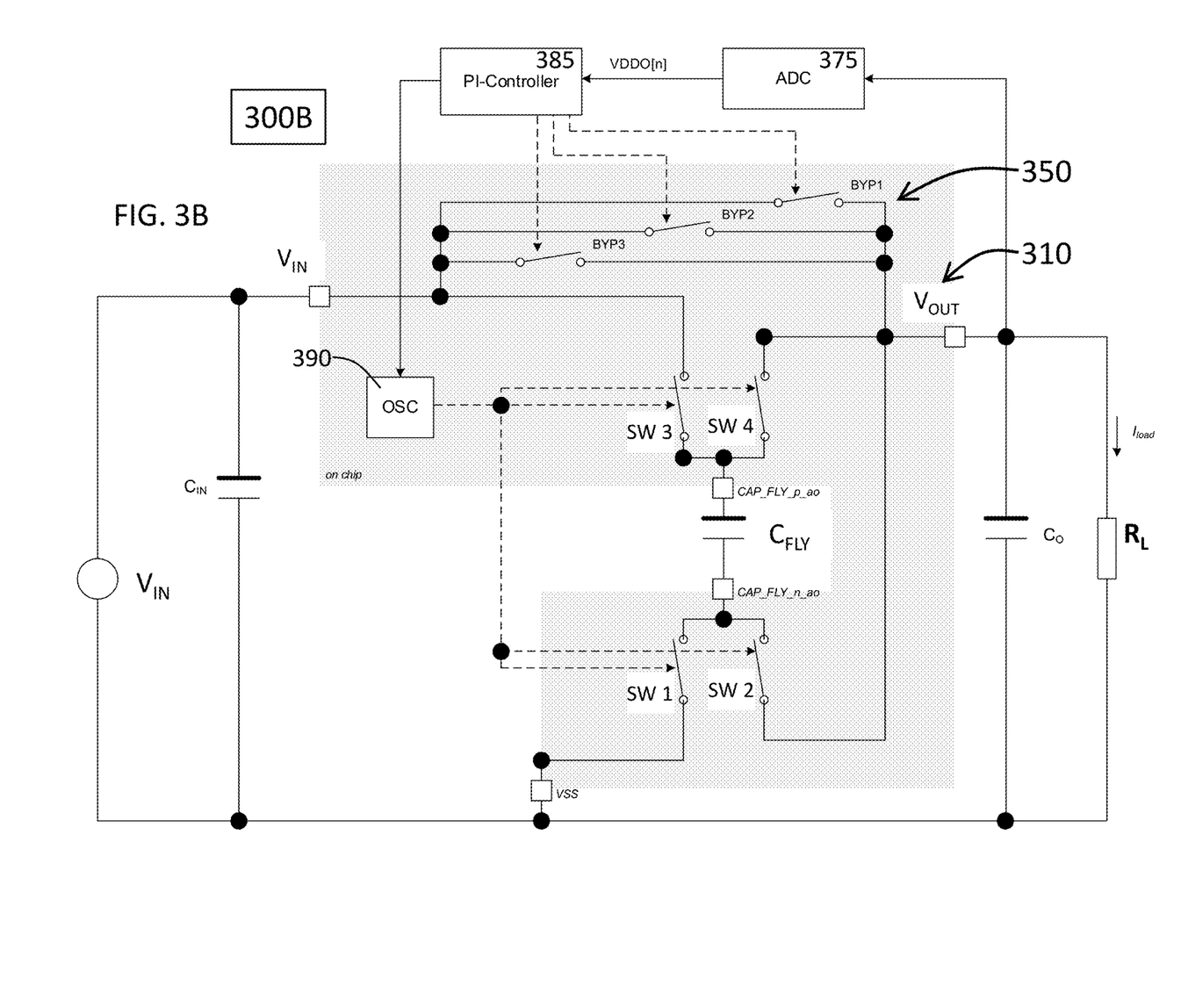

FIG. 3B shows a converter 300B according to one or more exemplary embodiments of the present disclosure. The converter 300B may be the same or similar to the converter 300A in several aspects and such components may be designated with the same the reference numerals as the converter 300A of FIG. 3A.

The converter 300B, instead of the controller 370, may include a PI-controller or PID controller 380 and an analog-to-digital converter (ADC) 375. The controller 380 may receive values from the ADC 375 representative of the voltage provided to the load $R_L$, $V_{OUT}$. Based on this input or signal(s) received from the ADC 375, the PI-controller 380 can be configured to effectuate an appropriate voltage output by the SC-DCDC circuit 310 and the bypass converters BYP1-BYP3. In other words, the PI-controller 380 can control both the SC-DCDC circuit 310 and the bypass converters BYP1-BYP3 to provide an appropriate output for maintaining a voltage to the load $R_L$. The PI-controller 380 interfaces with the bypass controllers BYP1-BYP3 so to control their switching on and off. Similarly, the PI-controller 380 can interface with or control the oscillator 390 which controls the opening of the main switches (e.g., switches SW1-SW4 in example of FIG. 3B). The PI-controller 380 can change the frequency of the oscillator, which affects the closing and opening of the main switches so as to modify the current and voltage to be provided to the load $R_L$.

In various embodiments of the present disclosure, controllers described herein may obtain and/or determine a conductance, which can be used as a control word for such controllers. The determined conductance can define the output power (e.g. amount of output current at fixed voltage). For example, this conductance can be obtained or determined from the input received from an ADC.

In various examples, a controllers described herein can transfer or translate this control word into the specific regulation signals for the bypass switches. Further, the control word can be used to control the oscillator which changes the frequency of the switching (rate of closing and opening) the main switches.

In our implementation bypass switches updated every time with change of control word, so they may switch with the frequency of update of control word, which may be equal to the switching frequency of main switches.

Figure 4:
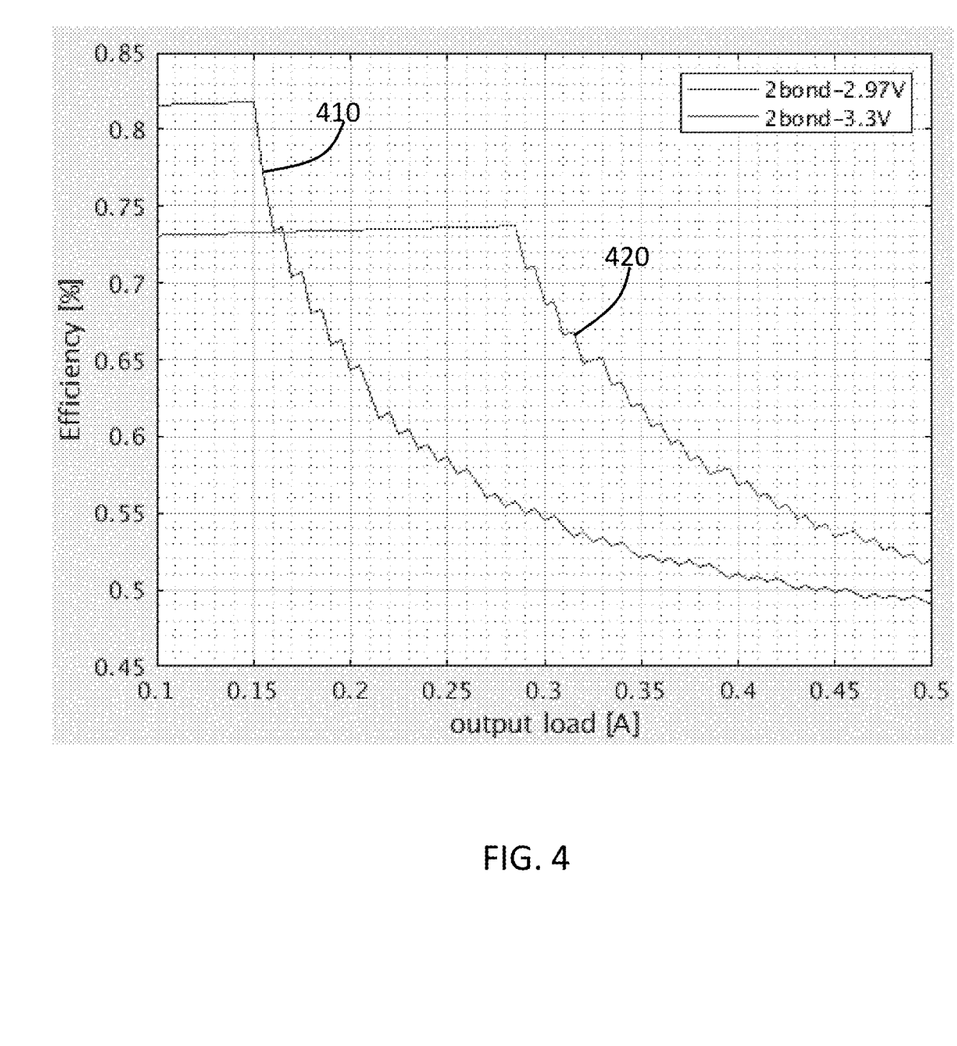
FIG. 4 shows an efficiency graph.

FIG. 4 shows indicating the efficiency vs output load for a converter such as converter 300. The a plot for the converter for providing a constant 2.97 voltage and a 3.3 voltage over a range of output load (measured in Amperes) vs efficiency is shown. Both plots show a gradual, instead of a sharp, decrease in efficiency as the output load requirement (e.g., required current) increases.

Figure 5:
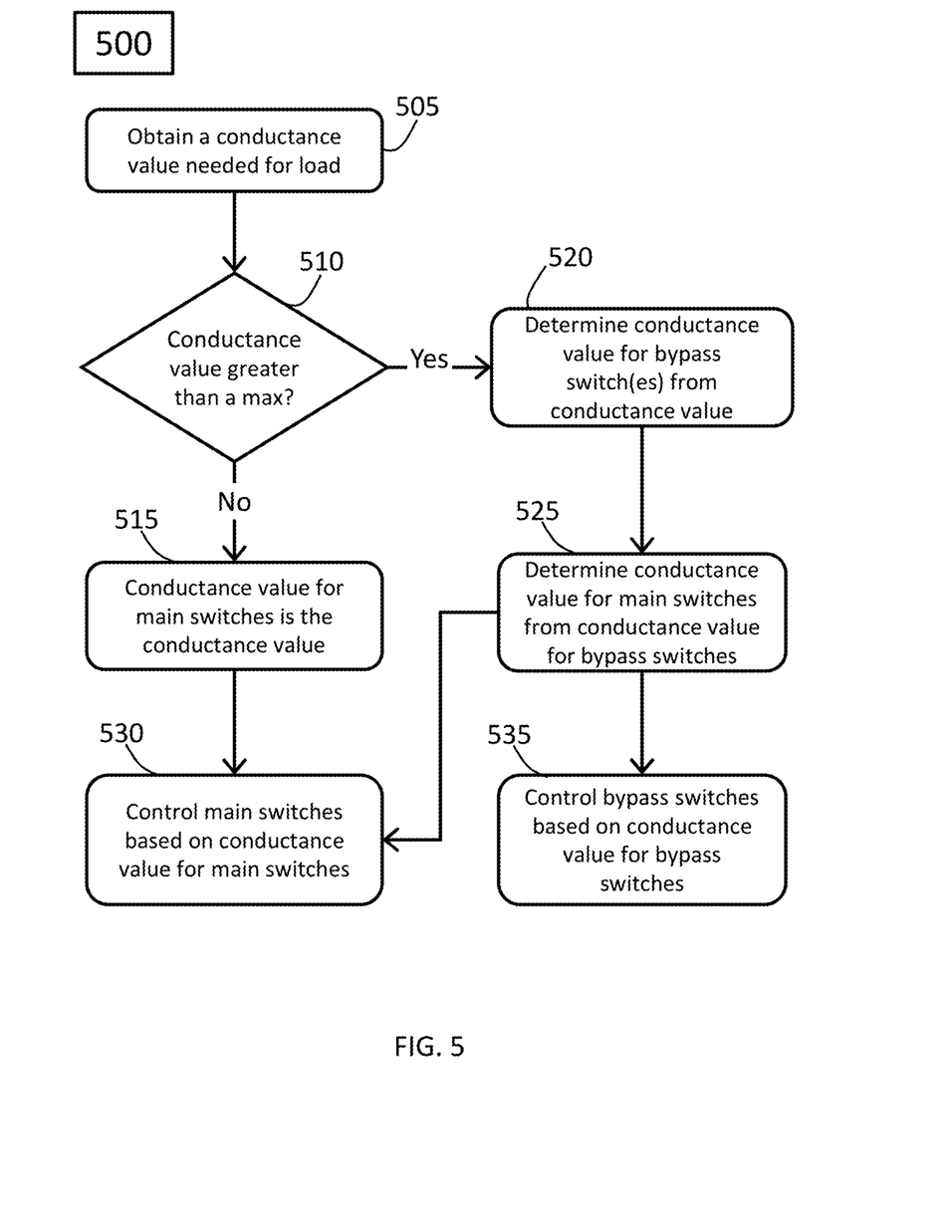
FIG. 5 shows a flow diagram of an example method according to at least one exemplary embodiment of the present disclosure.

FIG. 5 shows, according to at least one exemplary embodiment of the present disclosure, an exemplary flow diagram. The flow diagram is a method or process 500 that may be implemented by a controller of a converter, e.g., a converter such as converter 300 having a SC-DCDC circuit and one or more bypass switches that can be connected or coupled between an input and output of the SC-DCDC circuit. The controller can control the SC-DCDC circuit and one or more bypass switches according to the method 500.

At 505, a conductance value may be obtained or determined by a controller, wherein this conductance value indicates how much current the converter should provide to the a load to maintain a constant or near constant voltage. After obtaining this conductance value, at 510, the controller can determine whether this conductance value is greater or less than a predefined threshold value. This threshold value may be a maximum conductance for the SC-DCDC converter. In other words, this maximum conductance value can correspond to a maximum current that the main switches of the SC-DCDC converter is capable of providing to the load, e.g., at a constant voltage.

In the case where the obtained conductance is less than the threshold, then the controller provides control (e.g., control signals) to keep the one or more bypass transistor switches turned off so as to not provide current to the load.

If, at 510, the obtained conductance value is not greater than the maximum conductance, then the process continues to 515 wherein controller determines the conductance value to be used for main switches (the SC-DCDC converter), is the obtained conductance value from 505. That is, the obtained conductance value corresponds to an amount of current (e.g., a current value) that can be provided by SC-DCDC circuit. Then, the process can proceed to 530, wherein the controller can control the main switches to provide the current according to the conductance value for the main switches/SC-DCDC converter.

If, at 510, the obtained conductance value at 505 is greater than the maximum conductance, then the process continues to 520 where a conductance value is determined for the one or more bypass transistor switches. This determined conductance value can indicate an amount of current (current value) that can be provided by the one or more bypass switches.

At 525, the controller determines a conductance value for the main switches. Accordingly, this conductance value may be determined as the difference between the obtained conductance value (at 505) and the conductance value determined for the bypass switches (520). That is, the obtained conductance at 520 may be a total conductance that satisfies the following relation:

Conductance_total=Conductance_main_switches+ Conductance_bypass

As such, At 520, the conductance value determined for the bypass switches (Conductance_bypass) is value that can be realized by the bypass switches and is chosen so that the remaining conductance value is a conductance value that can be realized by the SC-DCDC circuit (Conductance-_main_switches) (e.g., less than the maximum threshold for the SC-DCDC circuit).

After 525, the process can proceed to 530 and 535. At 530 the controller can control the main switches to provide a current to the load based on the conductance value for the main switches (Conductance_main_switches), and at 535 the controller can also (e.g., simultaneously) control the bypass switches to provide a current on the load based on the conductance value for the bypass switches (Conductance_bypass). Therefore, in this case, the controller controls the main switches and the one or more bypass transistor switches so that a combined current is provided to the load.

The process 500 of FIG. 5, may be done repeatedly as the controller obtains new conductance or needed conductance values for the load. For example, the controller may obtain conductance values by constantly or repeatedly monitoring or detecting the voltage or conductance at the load. The voltage of the load, may be converted, via an analog-to-digital converter (not shown) into values that are processed by the controller to determine the needed conductance or needed current to be supplied so as to keep the voltage at the load constant.

Figure 6:
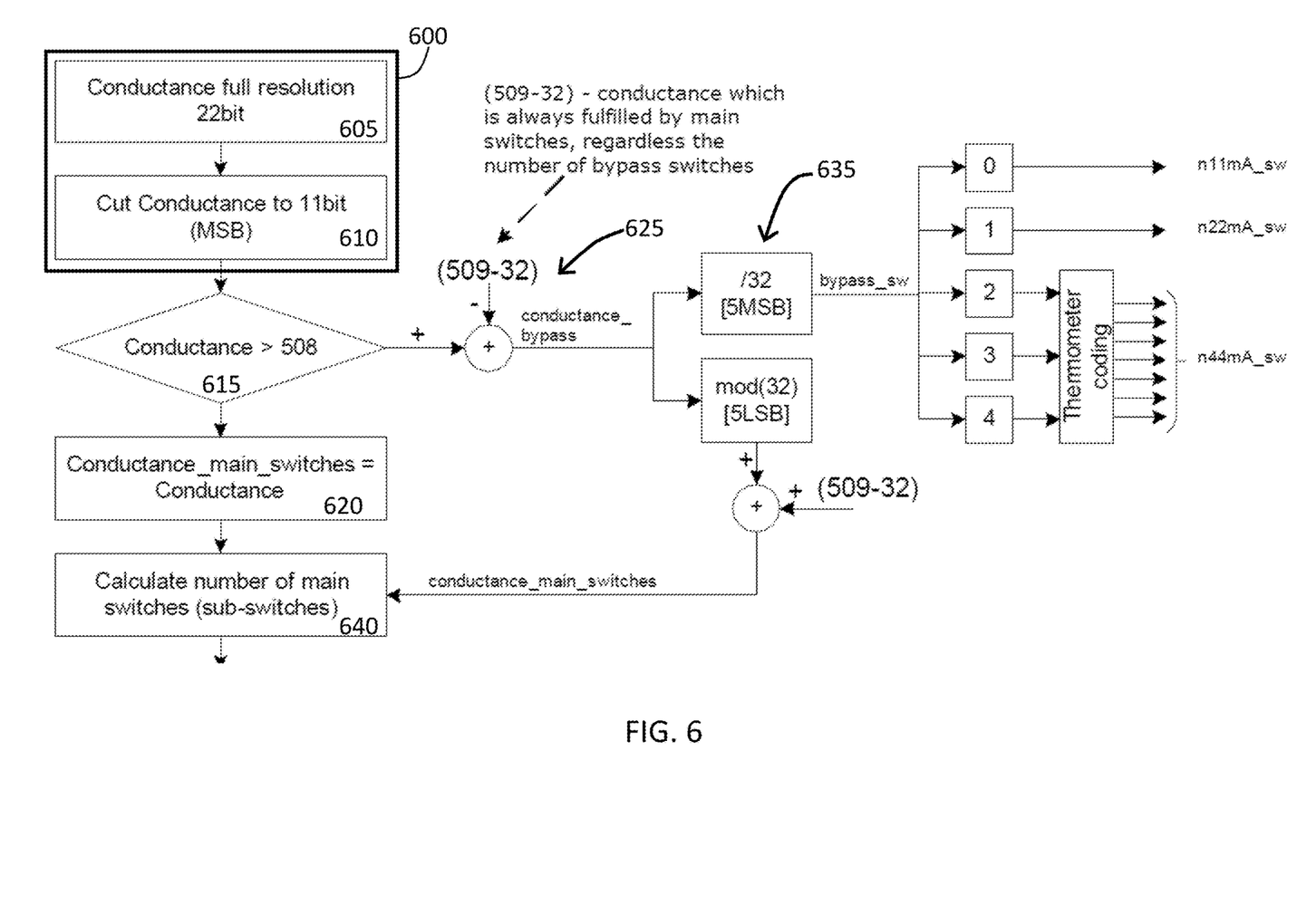
FIG. 6 shows a flow diagram of an example method according to at least one exemplary embodiment of the present disclosure.

FIG. 6 shows an exemplary flow for digitally controlling a main switches of a SC-DCDC circuit and a plurality of bypass transistor switches. The values, parameters, other settings used in the flow of FIG. 6 are merely exemplary and used for demonstration purposes.

As shown in FIG. 6, a controller may obtain a conductance value at 600. In some examples, this may consist of receiving a conductance value at a full resolution, e.g., 22 bit resolution at 605. The process may further include at 610 a shortening or cutting the conductance, e.g., for processing reasons, to an 11 bit value. However, such 605 and 610 may not be necessary.

The process can proceed to see if this conductance value is greater than a max conductance value at 615. In the example of FIG. 6, this max conductance value (the maximum conductance value corresponding to the maximum output current capability for the main switches of a SC-DCDC converter) is 508, which may correspond to a 175 mA current.

If the value of the obtained conductance is less than the max conductance value at 615, then the process can proceed to 620 wherein a conductance value for the main switches is set to this obtained conductance value. Then at 640, the controller can use the set conductance value to calculate or determine the number and/or which switches of the SC-DCDC converter to control. Other factors may be determined, such as the switching frequency of the control the main switches. From this determination, the SC-DCDC converter can be controlled, e.g., the controller can send input or control signals to operate the SC-DCDC circuit based on the determined or calculated parameters.

If the obtained conductance value is more than the max conductance value at 615, then the process proceeds to 625. In this example in FIG. 6, the obtained conductance value may be 509, which is greater than the max conductance value of 508. As such, the controller proceeds to 625 to determine a conductance value for the bypass switches. This conductance value corresponds to an amount of current that is to be provided by the bypass switches to supplement a current to be provided by the main switches. As noted earlier, the total current to be provided by the converter is a sum of the output current of the main switches and an output current of the one or more bypass transistor switches Accordingly, the determined conductance value of the bypass switches must meet a minimum value so that the remaining conductance for the main switches is less than the max conductance for the main switches.

In this case, the determined conductance may be 32 and thus the remaining to be provided by the main switches is 509–32.

In another exemplary situation, a determined total conductance value may be 515, which is also above the maximum threshold. Accordingly, determining the conductance or conductance value for the bypass switches in this example is may be done by first calculating amount above a threshold, minus 32, where 32 corresponds to the minimum or smallest conductance value that can be fulfilled or provided by the bypass switches. In this case the calculation is:

515−(509−32)=38.

Next, integer division of 38/32 yields 1. This value corresponds to the smallest bypass switch in this example and can be used for controlling this switch. For example, different values obtained from this calculation, e.g., greater than 1, can cause bypass switches other than the smallest bypass switch to be used.

Further, applying a modulo 32 operation to 38 (38% 32) returns a value 6. This value is a fractional correction value that is added or included in the conductance value to be provided by the main switch:

(509−32)+(38% 32)=477+6=483

Consequently, the main switches provide an output corresponding to a conductance value 438, and the bypasses switches provide an output corresponding to a conductance value of 32.

In accordance with exemplary embodiments of the present disclosure, the switch from using only the main switches for providing a constant voltage to the output load to using both the main switches and the bypass switches can occur before the maximum current capability of the SC-DCDC circuit is reached. That is, a controller, e.g., a PI-controller can cause the use of the bypass transistors in addition the SC-DCDC circuit to provide output current before the SC-DCDC circuit reaches its maximum output. This can allow for better regulation of small ripples of the output current from the SCDCDC which has a better resolution in current. As such, the same calculations or approach as described in the examples above can be used, except that the maximum threshold (which can used to determined when to begin using the bypass transistors), can be lower than the maximum capability of the SC-DCDC circuit.

Based on the design of the converter in accordance with exemplary embodiments of the present disclosure, the conductance values of the bypass transistor switches may be in powers of 2. Further, in the case of there being a plurality of bypass transistor switches, there can be a base switch with the one or more other switches having conductance values that are multiples of the base switch. For example, for a case in where there are three (3) bypass switches as is the case in FIG. 6, these bypass switches can be sized with a first (base) switch configured to deliver 44 mA (equivalent to 128 Conductance), a second switch, with twice the resistance as the base switch, configured to deliver 22 mA (equivalent to 64 Conductance), and a third switch, with 4 times the resistance as the base switch, configured to deliver 11 mA (equivalent to 32 Conductance).

Accordingly, after determining the conductance for bypass transistors, the process may continue at 635, which may include generating control signals for the bypass transistors.

In various embodiments, due to weighting of bypass switches as $2^n$ the conductance for the bypass (Conductance_bypass) can split and converted into direct control signals for the switches using shift register operations. With the bypass switches having sizing as given in the above example, the proper control signals can be generated by dividing the conductance value of the bypass transistors by 32, which can be accomplished by shift register functions.

In this example, since the signals will have smaller values after division by 32, the controller may consider only need to consider less digits or bits, e.g., the 5 most-significant digits (MSB) for control signals. The control signals may be provided to an interface, represented by the blocks numbered 0 to 4 in FIG. 6, which then can control or turn on the bypass transistor switches. By generating the conductance value for the bypass switches, the conductance value for the main switches can be generated, as the remainder, as explained before.

In accordance with some embodiments, thermometer coding may be used for interfacing with the switches. The thermometer coding can transfer an integer value N to a binary value with number of bits M, where N lower LSBs are 1 and all other MSBs are 0. For example, integer 5 can be translated or transferred to a thermometer code of 7 bits=0011111. In FIG. 6, the interfaces "4 3 2" can represent an integer value in binary for (e.g., 5 is 101) and is afterwards transferred by the thermometer coding to a 7 bit thermometer code (0011111), which directly controls 7 bypass switches associated with 44 mA of current.

Accordingly, the method of FIG. 6 can also proceed to 640, to determine which switches should be used for generating the needed conductance (output current) for the SC-DCDC converter.

In accordance with exemplary embodiments, the exemplary process flows of FIGS. 5 and 6 may be repeated. That is, the controllers described herein may be configured to repeatedly and continually determining how to control the SC-DCDC circuit and one or more bypass transistors to provide a current at a constant voltage to an output load.

Figure 7:
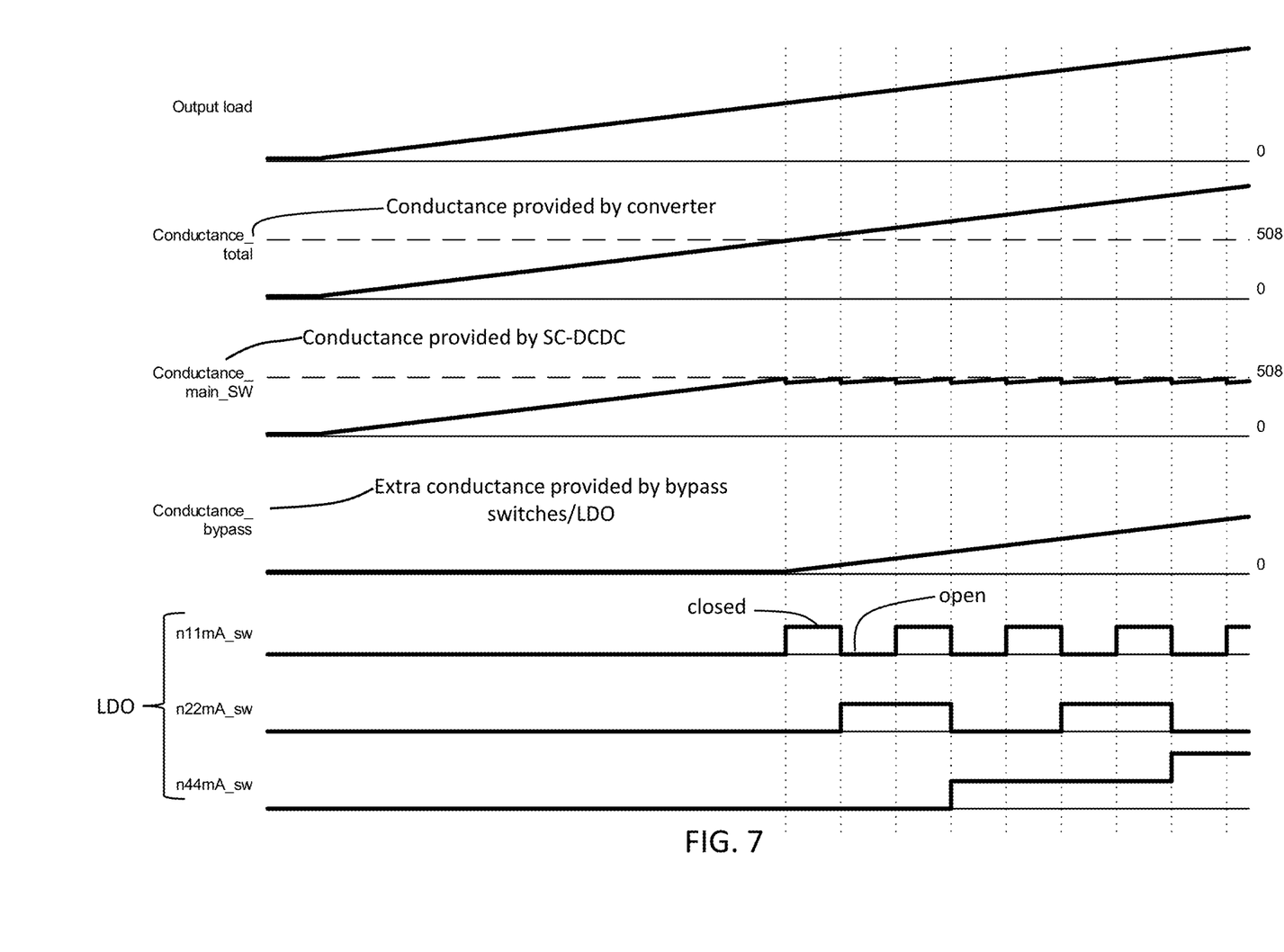
FIG. 7 shows a graph including plots of various electrical characteristics of example components of converters of the present disclosure.

FIG. 7 is an exemplary graph shows comparing the how the change in output load over time affects changes in total conductance for the load (Conductance_total), in the conductance provided by the main switches/SC-DCDC converter (Conductance_main_SW), the conductance provided by the bypass transistor switches as a whole (Conductance_bypass), and the conductance provided by the three individual switches, (n11mA_sw, n22mA_sw, n44mA_sw) for the example of FIG. 6. As shown, no conductance (or current) is provided by the bypass transistor switches until the conductance by the main switches reaches a maximum (508 in this example). For decrease of the output load everything is simply reversed.

The following examples pertain to further exemplary implementations.

Example 1 is a converter which may include a switched capacitor circuit that includes one or more capacitors; and a plurality of main switches to provide an output current in response to an input voltage applied to the switched capacitor circuit, the converter further including one or more bypass transistor switches connected to selectively provide an additional output current, wherein a total current output of the converter is a sum of the output current provided by the switched capacitor circuit and any additional output current provided the one or more bypass transistor switches; and a common controller to control the plurality of main switches of the switched capacitor circuit and the one or more bypass transistor switches based on a current required by a load.

Example 2 is the subject matter of Example 1, wherein the common controller may be configured to control the one or more bypass transistor switches to selectively provide the additional output current.

Example 3 is the subject matter of Example 2, wherein the common controller may be configured to control the one or more bypass transistor switches to selectively provide the additional output current comprises the common controller to cause the one or more bypass transistor switches to provide the additional output current in the event the output current of the switched capacitor circuit reaches or exceeds a maximum current capability of the switched capacitor circuit.

Example 4 is the subject matter of Example 2 or 3, wherein the common controller is configured to control the one or more bypass transistor switches to selectively provide the additional output current the common controller configured to cause the one or more bypass transistor switches to provide the additional output current so as provide a substantially constant voltage to the load.

Example 5 is the subject matter of Example 4, wherein the common controller may be configured to sense a voltage at the load.

Example 6 the subject matter of Example 5, wherein the common controller may be configured to detect a voltage at the load and further configured to control an amount of the additional current provided by the one or more bypass transistor switches based on the detected voltage at the load.

Example 7 is the subject matter of any of Examples 1 to 6, wherein the common controller may be configured to digitally control an amount of current provided by the switched capacitor circuit and an amount of additional current provided by the one or more bypass transistors.

Example 8 is the subject matter of Example 7, which may further be including: an analog-to-digital converter (ADC) configured to provide values corresponding to the voltage at the load to the common controller, wherein the wherein the common controller is configured to control the switched capacitor circuit and the one or more bypass switches based on the values provided by the ADC.

Example 9 is the subject matter of Example 8, wherein the common controller is configured to digitally control the one or more bypass transistor switches to provide the additional output current in response to determining the values corresponding to the voltage provided by the ADC exceed a maximum threshold value.

Example 10 is the subject matter of any of Examples 1 to 9, wherein the common controller is configured to cause the one or more bypass transistor switches to provide the additional output current by being configured to selectively close at least one of the bypass transistor switches.

Example 11 is a method for voltage regulation that may include: determining, by a controller, a total current value to be provided to an output load by a converter, the converter comprising a switched capacitor circuit and one or more bypass transistor switches; determining, by a controller, a first current value to be provided by the switched capacitor circuit of the converter, wherein the current value to be provided by the switched capacitor circuit is less than a maximum current value; determining, by a controller, a second current value to be provided by the one or more bypass transistor switches of the converter, wherein the second current value is the difference of the total current value and the first current value; providing a current to the output load from the switched capacitor circuit having the first current value; and providing a current to the output load from the one or more bypass transistor switches having the second current value.

Example 12 is the subject matter of Example 11, wherein the total current value may be a value of the current to maintain a substantially constant voltage at the output load.

Example 13 is the subject matter of Example 11 or 12, wherein maximum current value may be a maximum output current capability of the switched capacitor circuit.

Example 14 is the subject matter of any of Examples 11 to 13, wherein providing the current to the output load from the switched capacitor circuit may include the controller causing the switched capacitor circuit to output the current with the first current value, and wherein providing the current to the output load from the one or more bypass transistor switches comprises the controller causing the one or more bypass transistor switches to output the current with the second current value.

Example 15 is a converter that may include: a switched capacitor DC to DC (SC-DCDC) converter circuit; a low-dropout voltage regulator (LDO) including one or more bypass transistor coupled in parallel to each other across an input and an output of the SC-DCDC converter circuit; and a controller common to the SC-DCDC and the LDO and configured to control the SC-DCDC converter circuit to provide a current to an output load of the converter and further configured to control the LDO to provide a supplemental current to supplement the current from the SC-DCDC converter circuit in response to the SC-DCDC converter circuit operating at a maximum output capability.

Example 16 is the subject matter of Example 15, wherein the LDO may include a plurality of bypass transistor switches comprising base transistor switch configured to output a current with a first current value, and at least one second transistor switch configured to output a current with a second current value being a multiple of the first current value, wherein the current provided by the LDO is a sum of respective currents of the plurality of bypass transistor switches.

Example 17 is the subject matter of Example 16, wherein the controller may be configured to selectively control one or more of the plurality of bypass transistor switches by selectively causing the one or more of the plurality of bypass transistor switches to close with a respective switching frequency.

Example 18 is the subject matter of Example 17, wherein the SC-DCDC converter circuit operating at a maximum output capability may include the SC-DCDC converter circuit outputting a maximum capable output current.

Example 19 is the subject matter of any of Examples 15 to 18, wherein the controller may be configured to control the SC-DCDC circuit and the LDO so that the converter maintains a substantially voltage at the output load.

While reference is made to specific embodiments, it should be understood by those skilled in the art that various changes in form and detail may be made therein without departing from the spirit and scope as defined by the appended claims. The scope is thus indicated by the appended claims and all changes which come within the meaning and range of equivalency of the claims are therefore intended to be embraced.

What is claimed is:

1. A converter, comprising:
   a switched capacitor circuit including:
      one or more capacitors; and
      a plurality of main switches to provide an output current in response to an input voltage applied to the switched capacitor circuit;
   one or more bypass transistor switches configured to selectively provide an additional output current, wherein a total current output of the converter is a sum of the output current provided by the switched capacitor circuit and any additional output current provided the one or more bypass transistor switches; and
   a common controller to control the plurality of main switches of the switched capacitor circuit and the one or more bypass transistor switches based on a current required by a load.

2. The converter of claim 1, wherein the common controller is configured to control the one or more bypass transistor switches to selectively provide the additional output current.

3. The converter of claim 2, wherein the common controller is configured to cause the one or more bypass transistor switches to provide the additional output current when the output current of the switched capacitor circuit reaches or exceeds a maximum current capability of the switched capacitor circuit.

4. The converter of claim 2, wherein the common controller is configured to cause the one or more bypass transistor switches to selectively provide the additional output current to provide a substantially constant voltage to the load.

5. The converter of claim 4, wherein the common controller is configured to sense a voltage at the load.

6. The converter of claim 5, wherein the common controller is configured to detect a voltage at the load and further configured to control an amount of an additional current provided by the one or more bypass transistor switches based on the detected voltage at the load.

7. The converter of claim 1, wherein the common controller is configured to digitally control an amount of current provided by the switched capacitor circuit and an amount of additional current provided by the one or more bypass transistors.

8. The converter of claim 7, further comprising:
   an analog-to-digital converter (ADC) configured to provide values corresponding to a voltage at the load to the common controller,
   wherein the common controller is configured to control the switched capacitor circuit and the one or more bypass switches based on the values provided by the ADC.

9. The converter of claim 8,
   wherein the common controller is configured to digitally control the one or more bypass transistor switches to provide the additional output current in response to determining that the values provided by the ADC exceed a maximum threshold value.

10. The converter of claim 1, wherein the common controller is configured to selectively close at least one of the bypass transistor switches to cause the one or more bypass transistor switches to provide the additional output current.

11. A method for voltage regulation comprising:
determining, by a controller, a total current value to be provided to an output load by a converter, the converter comprising a switched capacitor circuit and one or more bypass transistor switches;
determining, by a controller, a first current value to be provided by the switched capacitor circuit of the converter, wherein the first current value to be provided by the switched capacitor circuit is less than a maximum current value;
determining, by a controller, a second current value to be provided by the one or more bypass transistor switches of the converter, wherein the second current value is a difference of the total current value and the first current value;
providing a current having the first current value to the output load from the switched capacitor circuit; and
providing a current having the second current value to the output load from the one or more bypass transistor switches.

12. The method of claim 11, wherein the total current value is a value of the current to maintain a substantially constant voltage at the output load.

13. The method of claim 11, wherein maximum current value is a maximum output current capability of the switched capacitor circuit.

14. The method of claim 11, wherein providing the current to the output load from the switched capacitor circuit comprises, by the controller, causing the switched capacitor circuit to output the current with the first current value, and wherein providing the current to the output load from the one or more bypass transistor switches comprises, by the controller, causing the one or more bypass transistor switches to output the current with the second current value.

15. A converter comprising:
a switched capacitor DC to DC (SC-DCDC) converter circuit;
a low-dropout voltage regulator (LDO) including one or more bypass transistors coupled in parallel to each other across an input and an output of the SC-DCDC converter circuit; and
a controller common to the SC-DCDC and the LDO and configured to control the SC-DCDC converter circuit to provide a current to an output load of the converter and further configured to control the LDO to provide a supplemental current to supplement the current from the SC-DCDC converter circuit in response to the SC-DCDC converter circuit operating at a maximum output capability.

16. The converter of claim 15, wherein the LDO includes a plurality of bypass transistor switches comprising base transistor switch configured to output a first current with a first current value, and at least one second transistor switch configured to output a second current with a second current value, wherein the second current value is a multiple of the first current value, wherein the current provided by the LDO is a sum of respective currents of the plurality of bypass transistor switches.

17. The converter of claim 16, wherein the controller is configured to selectively control one or more of the plurality of bypass transistor switches by selectively causing the one or more of the plurality of bypass transistor switches to close with a respective switching frequency.

18. The converter of claim 17, wherein the SC-DCDC converter circuit operating at a maximum output capability comprises the SC-DCDC converter circuit outputting a maximum capable output current.

19. The converter of claim 15, wherein the controller is configured to control the SC-DCDC converter circuit and the LDO so that the converter maintains a substantially voltage at the output load.

* * * * *